(12) United States Patent
Imai et al.

(10) Patent No.: US 9,773,521 B2
(45) Date of Patent: Sep. 26, 2017

(54) INFORMATION RECORDING DEVICE AND INFORMATION RECORDING METHOD

(71) Applicant: HITACHI, LTD., Tokyo (JP)

(72) Inventors: Ryo Imai, Tokyo (JP); Koichi Watanabe, Tokyo (JP); Manabu Shiozawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/106,879

(22) PCT Filed: Jan. 17, 2014

(86) PCT No.: PCT/JP2014/050755
§ 371 (c)(1),
(2) Date: Jul. 7, 2016

(87) PCT Pub. No.: WO2015/107669
PCT Pub. Date: Jul. 23, 2015

(65) Prior Publication Data
US 2016/0365107 A1    Dec. 15, 2016

(51) Int. Cl.
| | | |
|---|---|---|
| *G11B 7/1372* | (2012.01) | |
| *G11B 7/128* | (2012.01) | |
| *G11C 13/04* | (2006.01) | |
| *G11B 7/0045* | (2006.01) | |
| *G11B 7/0065* | (2006.01) | |
| *G11B 7/127* | (2012.01) | |

(Continued)

(52) U.S. Cl.
CPC ............ *G11B 7/128* (2013.01); *G11B 7/0045* (2013.01); *G11B 7/0065* (2013.01); *G11B 7/00772* (2013.01); *G11B 7/127* (2013.01); *G11B 7/1372* (2013.01); *G11C 13/04* (2013.01); *G11B 7/0033* (2013.01); *G11B 2007/0009* (2013.01)

(58) Field of Classification Search
None
See application file for complete search history.

(56) References Cited

U.S. PATENT DOCUMENTS

| | | |
|---|---|---|
| 5,694,249 A | 12/1997 | Misawa |
| 2005/0180302 A1 | 8/2005 | Tamada |

(Continued)

FOREIGN PATENT DOCUMENTS

| | | | |
|---|---|---|---|
| JP | 2001-005054 A | 1/2001 | |
| JP | 2006-078686 A | 3/2006 | |

(Continued)

OTHER PUBLICATIONS

Manabu Shiozawa et al., "Simultaneous Multi-Bit Recording in Fused Silica for Permanent Storage", Japanese Journal of Applied Physics, 2013, vol. 52, pp. 09LA01-1 to 09LA01-4.

(Continued)

*Primary Examiner* — Brian Butcher
(74) *Attorney, Agent, or Firm* — Mattingly & Malur, PC

(57) ABSTRACT

In recording technologies for batch formation of a plurality of recording bits in a recording medium by forming a plurality of optical spots using an ultrashort pulse laser and a spatial optical modulator, the batch recordable bit number has an upper limit, resulting in restricted recording speed. The intensity of the optical spot is corrected to increase the batch recordable bit number for increasing the recording speed.

6 Claims, 14 Drawing Sheets

(51) Int. Cl.
    *G11B 7/007* (2006.01)
    *G11B 7/00* (2006.01)
    *G11B 7/0033* (2006.01)

(56) References Cited

U.S. PATENT DOCUMENTS

2005/0270609 A1* 12/2005 Chuang .................. G11B 7/28
                                                               359/22
2006/0050339 A1     3/2006 Kawano et al.

FOREIGN PATENT DOCUMENTS

JP       2011-253600 A    12/2011
WO     2004/036565 A1   4/2004

OTHER PUBLICATIONS

Gladys Minguez Vega et al., "High spatiotemporal resolution in multifocal processing with femtosecond laser pulses", Optics Letters, Sep. 1, 2006, pp. 2631-2633.
Holography Zairy-Oyo Binran, NTS Inc., Jun. 11, 2007, pp. 404-419.
Masaaki Sakakura et al., "Improved phase hologram design for generating symmetric light spots and its application for aser writing of waveguides", Optics Letters, Apr. 1, 2011, pp. 1065-1067, vol. 36, No. 7.
International Search Report of PCT/JP2014/050755 dated Feb. 18, 2014.

\* cited by examiner

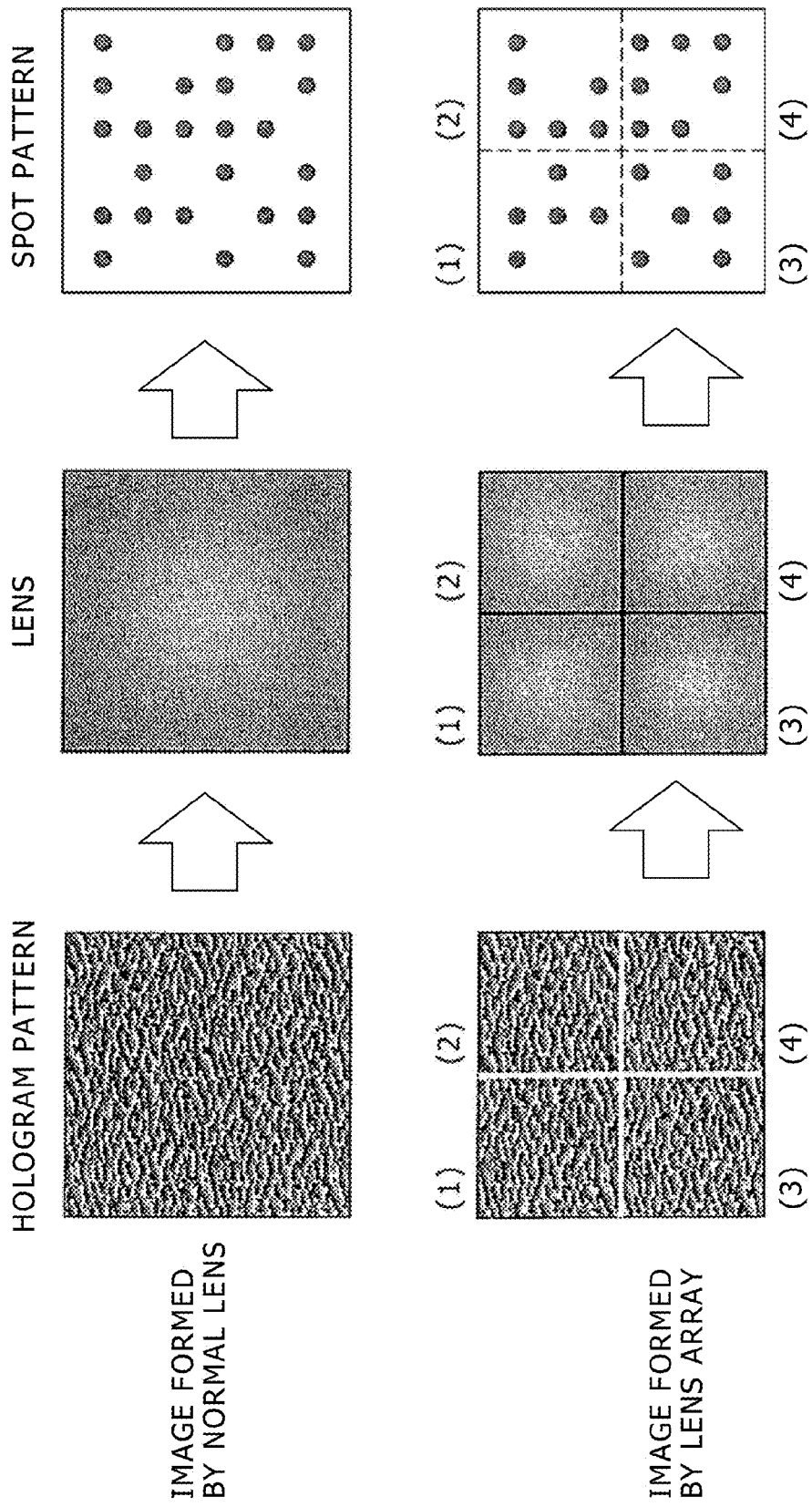

INFORMATION RECORDING DEVICE AND INFORMATION RECORDING METHOD

TECHNICAL FIELD

The present invention relates to an information recording device for optically recording information in a medium, and an information recording method.

BACKGROUND ART

It has been known that irradiation of short pulse laser to the inside of a transparent medium causes chemical and physical changes in the inner structure of the medium as a result of the nonlinear optical effect. It is therefore possible to record the information inside the transparent medium by means of the structural change. Patent Literature 1 discusses the three-dimensional memory for information recording by utilizing the structural change of the recording medium as the recording bit. When recording the information by using the short pulse laser, the laser beam is divided into a plurality of spots for increasing the recording speed so that information data of multiple bits is simultaneously recorded. Specifically, Nonpatent Literature 1 discloses the technique which allows the spatial optical modulator to divide the laser beam into a plurality of spots for irradiating the quartz glass so as to ensure batch recording of information data of the multiple bits inside the quartz glass.

CITATION LIST

Patent Literature

Patent Literature 1: U.S. Pat. No. 5,694,249

Nonpatent Literature

Nonpatent Literature 1: M. Shiozawa et. al., "Simulatenous Multi-Bit Recording in Fused Silica for Permanent Storage", Jpn. J. Appl. Phys. Vol. 52, pp. 09LA01, 1-4

Nonpatent Literature 2: G. Minguez-Vega et. al., "High spatiotemporal resolution in multifocal processing with femtosecond laser pulses", Opt. Lett., Vol. 31, pp. 2631-2633

SUMMARY OF INVENTION

Technical Problem

Satisfying requirements for improving both recording quality and recording speed allows application of the aforementioned technique to storage. In the case of simultaneous information recording by a plurality of optical spots, the recording speed may be defined as the product of an amount of information recorded by the single optical irradiation and the number of times of recording per unit of time. The number of times of recording per unit of time is determined by the speed for driving the spatial optical modulator that controls the optical spot shape, and the stage that controls the medium position. Accordingly, the aforementioned speed is restricted structurally in principle. Therefore, a recording sufficient amount of information through the single optical irradiation is indispensable for increasing the recording speed.

It has been newly discovered that the increase in the amount of information to be batch recorded causes loss of the record mark as shown in FIG. 1, thus deteriorating the recording quality. FIG. 1 is an enlarged view representing the respective recorded states derived from recording checkered pattern inside the transparent medium. The X mark in the drawing indicates a position of an optical axis. The aforementioned failure is caused by lowered optical intensity as a result of enlargement of the optical spot for recording in a direction apart from the optical axis as shown in FIG. 2. None of the aforementioned generally employed cases have the intention to satisfy the requirements for improving both multi-bit simultaneous recording in excess of several-hundred bits for information recording, and the recording quality. In the aforementioned cases, it is impossible to satisfy the requirements for improving both the recording quality and the recording speed.

Solution to Problem

The present invention may be configured as described below for solving the aforementioned problem.

(1) An information recording device includes a stage for holding an information recording medium, a short pulse laser source, a spatial optical modulator for displaying a hologram pattern so that a laser beam emitted from the short pulse laser source is modulated, and an image forming optical system having a focal length in inverse proportion to a parameter relating to a wavelength. A multi-point optical spot in accordance with the hologram pattern displayed on the spatial optical modulator is formed in the information recording medium held by the stage via the image forming optical system. A structural change is caused in the information recording medium by the multi-point optical spot for information batch recording by utilizing at least a region where intensity of the optical spot for recording is equal to or lower than 80% of intensity of the optical spot on an optical axis in the case where the focal length of the image forming optical system does not depend on the wavelength.

(2) An information recording device includes a stage for holding an information recording medium, a short pulse laser source, a spatial optical modulator for displaying a hologram pattern so that a laser beam emitted from the short pulse laser source is modulated, and a lens array in which a plurality of lenses each with the same focal length are arranged in a plane perpendicular to an optical axis of the laser beam. Each lens of the lens array forms a multi-point optical spot in accordance with the hologram pattern displayed in a region of the spatial optical modulator corresponding to the lens in a region of the information recording medium held by the stage, corresponding to the lens to cause a structural change in the information recording medium by the multi-point optical spot formed through the lens array for information batch recording.

(3) In an information recording method for performing information batch recording, a short pulse laser beam is modulated with a hologram pattern displayed on a spatial optical modulator to irradiate an information recording medium with a multi-point optical spot to cause a structural change in the information recording medium for information batch recording. The method includes a step of adjusting an optical irradiation position to the information recording medium, and a step of forming the multi-point optical spot in the information recording medium by setting the short pulse laser beam so that a length of the optical spot for recording is in a range of 125% of the length of the optical spot on an optical axis via an image forming optical system having a focal length in inverse proportion to a parameter relating to a wavelength.

In the optical machining field, the optical machining technique has been applied by means of the lens having the focal length in inverse proportion to the wavelength as disclosed in Nonpatent Literature 2. However, Nonpatent Literature 2 relates only to the machining technique using laser beam, which is not intended to be applied to the information recording field that demands satisfaction of the requirements for improving both the recording speed and the recording quality. In the optical recording field, use of the region with the optical spot intensity equal to or higher than 80% of the optical spot intensity on the optical axis is essential for maintaining the recording quality rather than the use of the region with the optical spot intensity lower than 80%. It is therefore meaningless to apply the lens employed in the optical machining field, having the focal length in inverse proportion to the wavelength to the optical recording field. The method as disclosed in Nonpatent Literature 2 is required to use the diffractive lens having the image forming performance inferior to that of the generally employed refractive lens. It is therefore inappropriate to apply the aforementioned method to the optical recording device demanded to execute optical control with high accuracy so as to prevent recording errors.

Advantageous Effects of Invention

The present invention is configured to correct intensity of the optical spot apart from the optical axis, and increase a recordable information amount through the single optical irradiation so as to ensure increase in the information recording speed.

Any other task, structure and advantageous effect besides those described above will be clarified by description of the embodiments as below.

BRIEF DESCRIPTION OF DRAWINGS

FIG. 14 is a schematic view illustrating a principle of the embodiment using a lens array.

DESCRIPTION OF EMBODIMENTS

Figure 1:
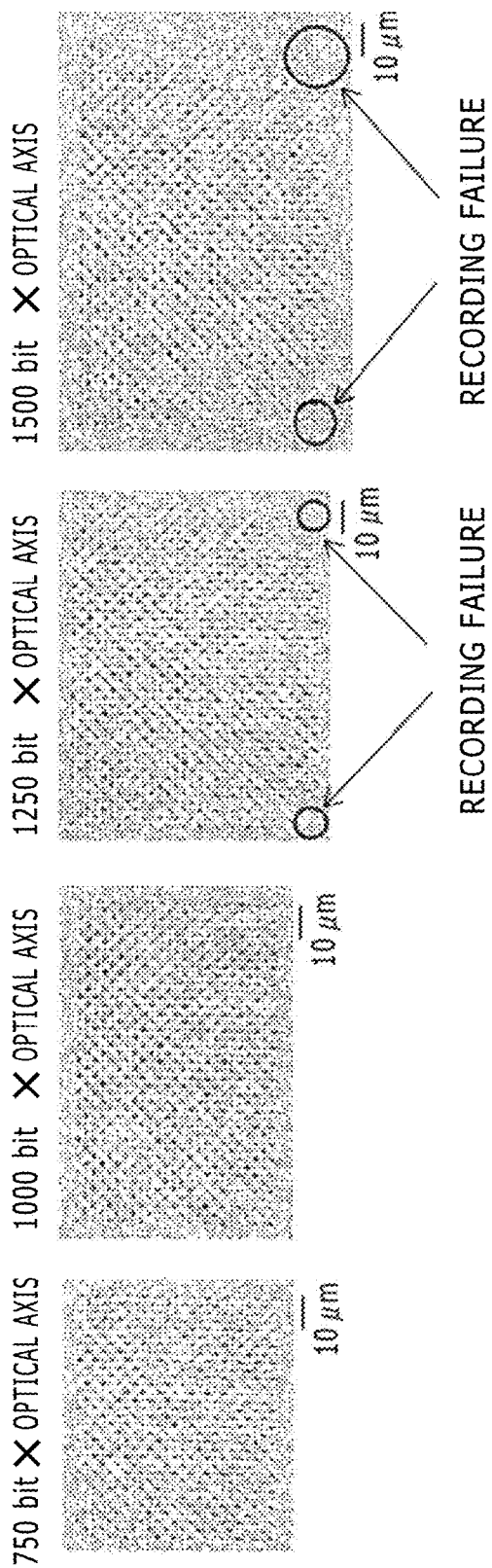
FIG. 1 is a view representing deterioration in the recording quality as a result of increasing the batch record bit number.
Figure 2:
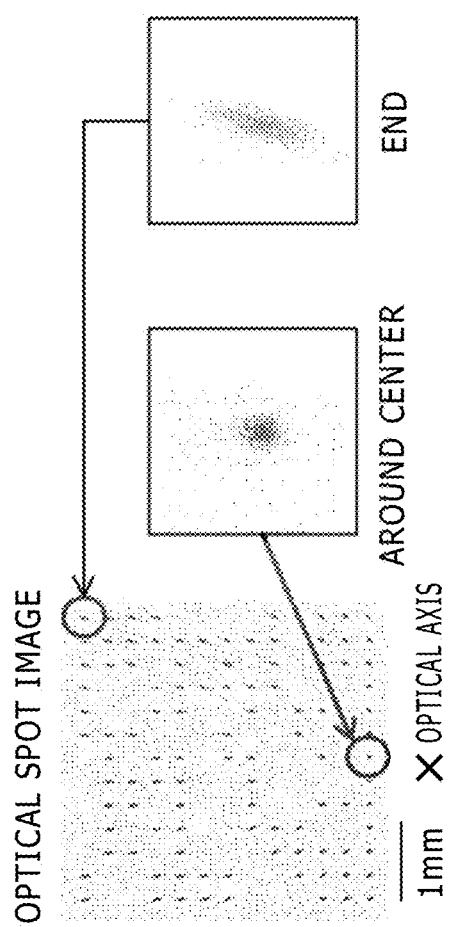
FIG. 2 is an enlarged view of an optical spot.

Embodiments of the present invention will be described referring to the drawings.

First Embodiment

Figure 3:
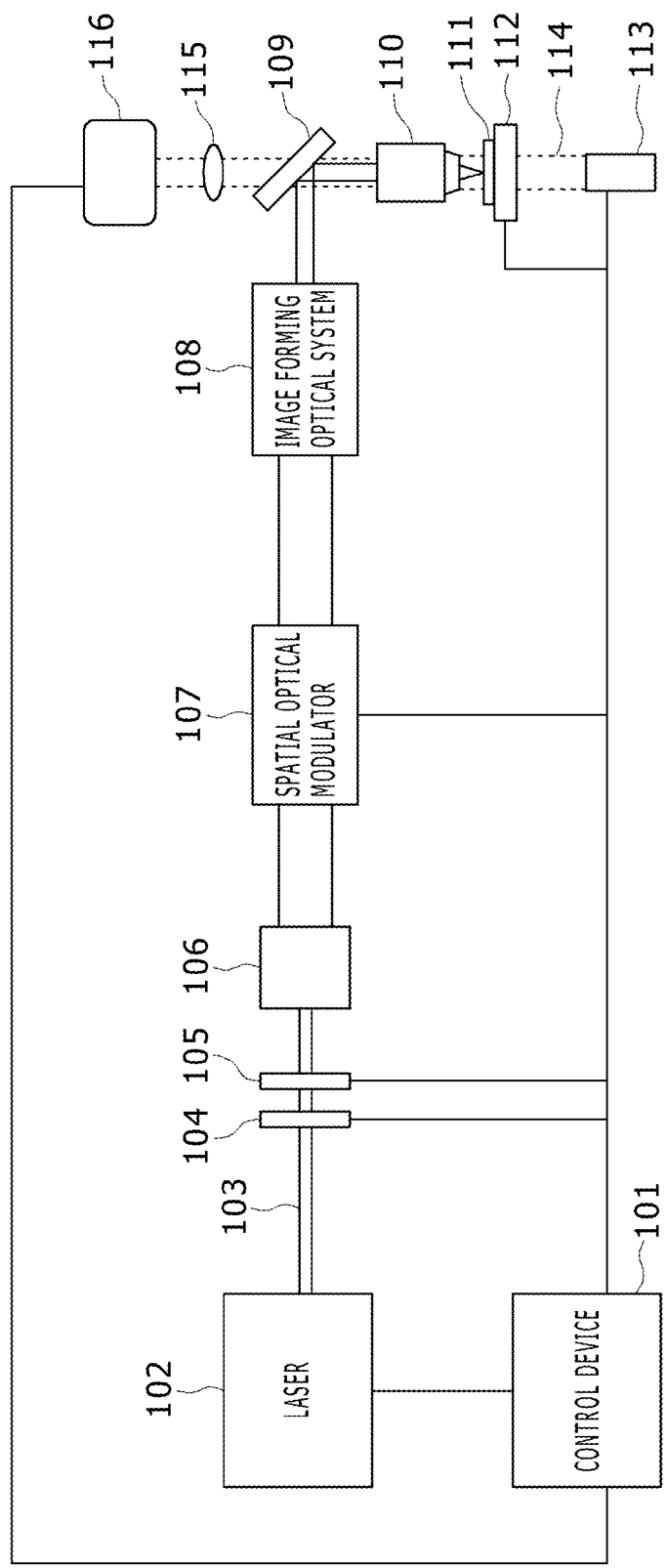
FIG. 3 is a schematic view representing an embodiment of an information recording device according to the present invention.

FIG. 3 is a schematic view representing an embodiment of the information recording device used for the recording method according to the present invention, The device includes a recording optical system, an observation optical system, and a control device 101 for controlling over the entire device. The recording optical system will be described, A short pulse laser 102 emits a laser beam 103. In the specification, the short pulse laser 102 is a laser source for emitting the laser beam with the pulse width on the order of femtoseconds or picoseconds. For example, titanium sapphire laser, fiber laser, picosecond solid-state laser, and the like may be employed as the short pulse laser. A shutter 104 controls a time period for irradiating the laser beam 103. An attenuator 105 controls intensity of the laser beam 103. The shutter 104 and the attenuator 105 may be built in the short pulse laser 102, or disposed outside the short pulse laser 102 separately as individual components. A beam diameter change optical system 106 changes the beam diameter of the laser beam 103 to an appropriate value upon its incidence to a spatial optical modulator 107 in consideration of the beam diameter of the laser beam 103, and an area of the modulation element of the spatial optical modulator 107. The shutter 104, the attenuator 105, and the beam diameter change optical system 106 do not have to be arranged in this order, but may be arranged with exchanged positions.

The spatial optical modulator 107 spatially varies the intensity and the phase of the laser beam 103, which may be realized by arranging a plurality of liquid crystal devices in grid shape, and varying the liquid crystal orientation direction for each liquid crystal device. In this case, the laser beam 103 is designed to permeate through the spatial optical modulator 107. However, the spatial optical modulation may be implemented by allowing the spatial optical modulator 107 to reflect the laser beam 103, The laser beam 103 modulated by the spatial optical modulator 107 is condensed onto a recording medium 111 by an image forming optical system 108 and an objective lens 110. A dichroic mirror 109 reflects the laser beam 103 for permeation through an illumination light 114 for observation, which will be described later.

The image forming optical system 108 and the objective lens 110 are configured to generate Fourier images of the laser beam 103 which has been modulated by a hologram pattern displayed on the spatial optical modulator 107 in the recording medium 111 for forming multi-point optical spots in accordance with the hologram pattern displayed on the spatial optical modulator 106. With the multi-point optical spots thus formed, dots are batch recorded on the surface or inside of the recording medium 111. Varying the hologram pattern to be displayed on the spatial optical modulator allows formation of an arbitrary optical spot pattern in the recording medium 111. For example, a transparent medium to the laser beam 103 such as the quartz glass may be employed as the recording medium 111. A stage 112 is configured to execute positional control of the recording medium 111 by means of a piezoelectric element and a stepping motor.

The observation optical system will be described, An illumination light source 113 emits the illumination light 114. The wavelength of the illumination light 114 is set to a value so as to allow permeation through the dichroic mirror 109 and the recording medium 111. The illumination light source may be constituted by the LED and the lamp unit. The illumination light 114 permeates through the recording medium 111 for forming an image on a camera 116 by the objective lens 110 and an image forming lens 115. The recording medium 111 may be observed by the camera 116 from the incident side of the laser beam 103. It may be observed at the area around a condensing point of the laser beam 103. Data of the camera 116 is transmitted to the control device 101. The control device 101 analyzes the data to calculate the size of the recorded bit and the signal intensity, and if necessary, sends feedback to the short pulse laser 102, the attenuator 104, the spatial optical modulator 107, and the like. In the case where the recording optical system is stably operated to hardly cause the recording error, the observation optical system does not have to be added. The optical system with another function for observing plasma emission generated upon recording may be provided for monitoring the recording condition.

The principle of the optical spot intensity correction according to the present invention will be described. Projection by the image forming optical system 108 and the objective lens 110 implements Fourier transformation of a magnetic field of the laser beam 103 at the record position into that of the laser beam 103 at the position of the spatial optical modulator 107. it will be expressed by the following formula.

$$E_{Rec} = FT_{k_x, k_y}[E_{SLM}] \quad \text{Formula 1}$$

where $E_{Rec}$ denotes the magnetic field of the laser beam 103 at the record position, $E_{SLM}$ denotes the magnetic field of the laser beam 103 at the position of the spatial optical modulator 107, and $k_x \cdot k_y$ denote the respective spatial frequencies in x-direction and y-direction upon Fourier transformation. The relationship between each of the spatial frequencies $k_x \cdot k_y$ and the optical parameter will be expressed by the following formula.

$$k_x = \frac{2\pi\alpha x}{\lambda f} k_y = \frac{2\pi\alpha y}{\lambda f} \quad \text{Formula 2}$$

where π denotes the circular constant, λ denotes a light wavelength, α denotes a magnification of the image forming optical system 108, f denotes a focal length of the objective lens 110, and x·y denote coordinates of the record positions. The positions (a, b) at which the light component with specific spatial frequency (ζ,η) is condensed on the spatial optical modulator 107 may be expressed by the following formula.

$$a = \frac{\lambda f \zeta}{2\pi\alpha} b = \frac{\lambda f \eta}{2\pi\alpha} \quad \text{Formula 3}$$

Figure 4:
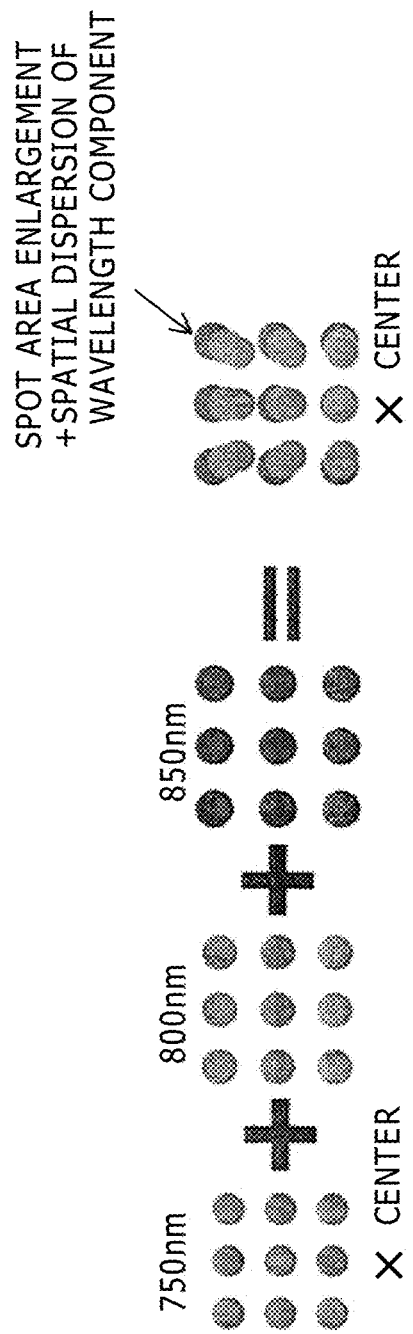
FIG. 4 is a schematic view illustrating a principle of optical spot enlargement.

The relationship expressed by the above formula allows the size of the optical spot pattern to be in proportion to the light wavelength λ. The short pulse laser beam 103 has the spectral width in inverse proportion to its pulse width. Therefore, as shown in FIG. 4, the spot patterns corresponding to the respective wavelength components differ from one another. The optical spot patterns corresponding to the respective wavelength components are overlapped with one another with respect to the optical axis as the center. Since the optical spot pattern shift is enlarged along with the increase in the distance from the optical axis, the resultant optical spot size is enlarged.

Enlargement of the optical spot size will be quantitatively described using the formula. It is assumed that the optical spot has a Gaussian form in the case of the single light wavelength. It is also assumed that, in the aforementioned case, the optical spot has the size sufficiently longer than the center wavelength of the laser beam 103, which may be determined without depending on the light wavelength. Under the aforementioned conditions, the spot size is calculated for each wavelength component, and the respective values are added. This makes it possible to calculate the actual optical spot size. The actual optical spot size may be expressed by the following formula.

$$l(r) = \frac{1}{\sqrt{2}} \frac{l_0^2 \omega_0}{l_0^2 \omega_0^2 - r^2 \omega_{ss}^2(r)} \quad \text{Formula 4}$$

where r denotes the distance from the optical axis, l(r) denotes the actual optical spot size, $l_0$ denotes the optical spot size in the case of the single light wavelength, $\omega_0$ denotes the center angular frequency of the laser beam 103. The $\omega_{ss}(r)$ denotes the spectral width at the center position of the optical spot generated at the position apart from the optical axis by the distance r, which may be expressed by the following formula. The $\omega_s$ denotes the spectral width of the laser beam 103 expressed by the angular frequency.

$$\omega_{ss}(r) = \frac{l_0 \omega_0 \omega_s}{\sqrt{l_0^2 \omega_0^2 + r^2 \omega_s^2}} \quad \text{Formula 5}$$

The optical spot intensity is in proportion to the spectral width as described above. Spatial dispersion of the respective wavelength components increases the pulse width τ(r) of the laser beam 103 at the position apart from the optical axis by the distance r, which is expressed by the following formula.

$$\tau(r) = \frac{2}{\omega_{ss}(r)} \quad \text{Formula 6}$$

Figure 5:
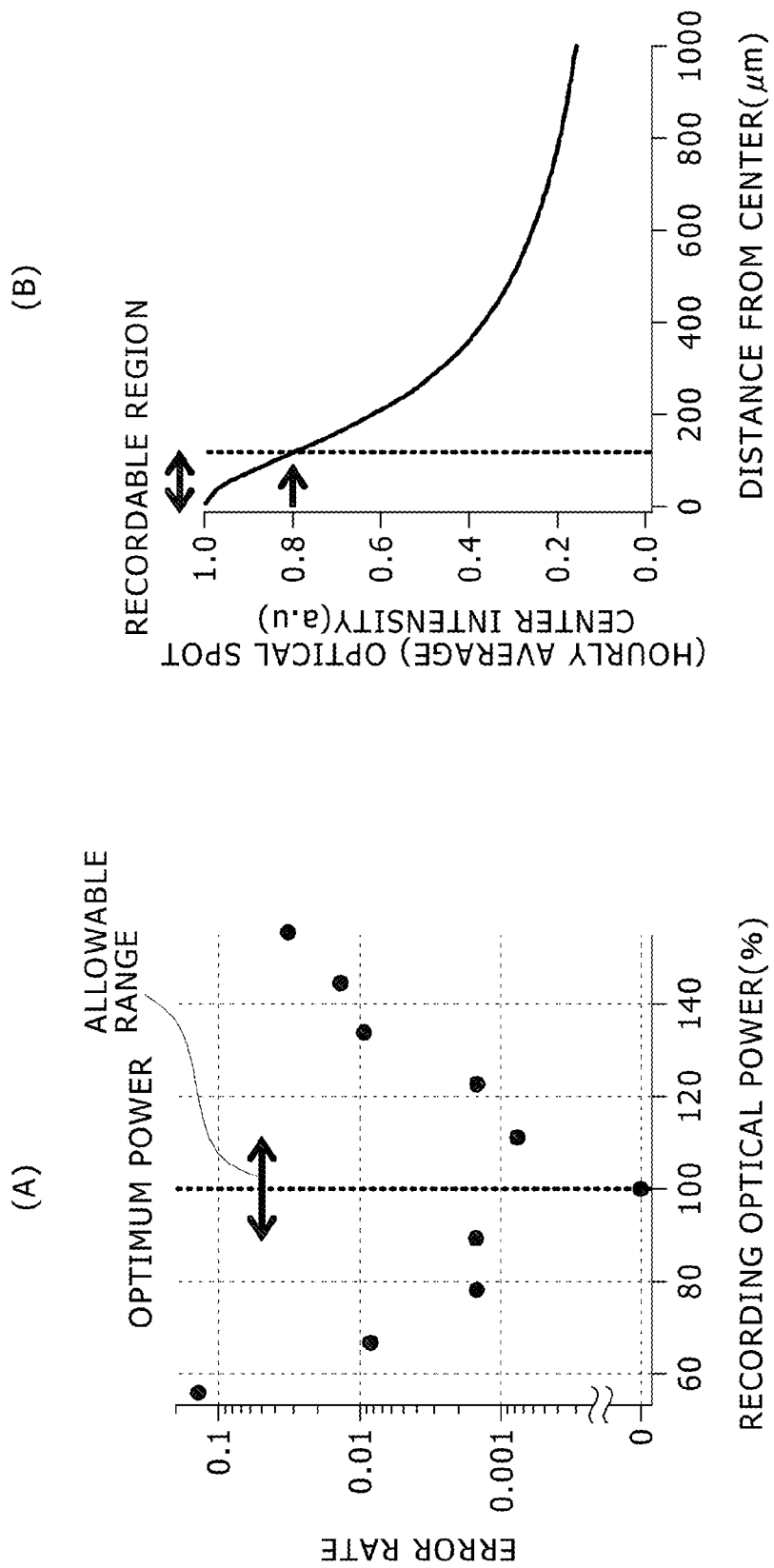
FIG. 5 is an explanatory view representing restriction of the recordable region resulting from the optical spot enlargement.

FIG. 5 shows the influence of the enlarged optical spot size as described above on the recording speed. FIG. 5A indicates dependency of the record error rate on the recording optical power. Assuming that the optimum recording power is set to 100%, allowable fluctuation in the optical intensity may be approximately +/−10% fir achieving errorless recording. FIG. 5B indicates calculation of the optical spot intensity under the data acquisition conditions as shown in FIG. 5A using the formula as described above. It is assumed that the intensity of the optical spot on the optical axis as shown in FIG. 5B is set to 1. As the allowable fluctuation margin of the optical intensity is approximately 20%, the recording error may occur in the region where the optical spot intensity becomes equal to or lower than 0.8. Therefore, the region available for recording is restricted to the one where the optical spot intensity is equal to or higher than 0.8, resulting in restriction of the upper limit bit number which allows batch recording. Since the recording speed is in proportion to the batch recording hit number, restriction of such batch recording bit number may further limit the recording speed.

In order to overcome the aforementioned restriction, the region where the optical intensity is normally lower than 80% has to be made available for recording. In the embodiment, the image forming optical system 108 is configured such that the image forming magnification is in inverse proportion to the parameter relating to the wavelength so as to solve the aforementioned problem. The parameter relating to the wavelength refers to the wavelength by itself, or the function having the wavelength as an argument. For example, in the case where the wavelength is employed as the parameter relating to the wavelength, the optical spot pattern size is in proportion to the wavelength. Conversely, the image forming magnification is in inverse proportion to the wavelength. Those contradicting effects are mutually negated so that the optical spot pattern size is kept constant with respect to all the wavelength components. Although it is impossible to realize the structure having the image forming magnification in inverse proportion to the wavelength because of restriction to the wavelength, pulse width, device size and the like, employment of the parameter relating to the wavelength besides the wavelength by itself allows the above-described restriction to be lessened. For example, in the case where the image firming optical system 108 is constituted by the glass lens with large refractive index dispersion, the function of the refractive index $n(\lambda)$ of the glass may be the parameter relating to the wavelength.

Figure 6:
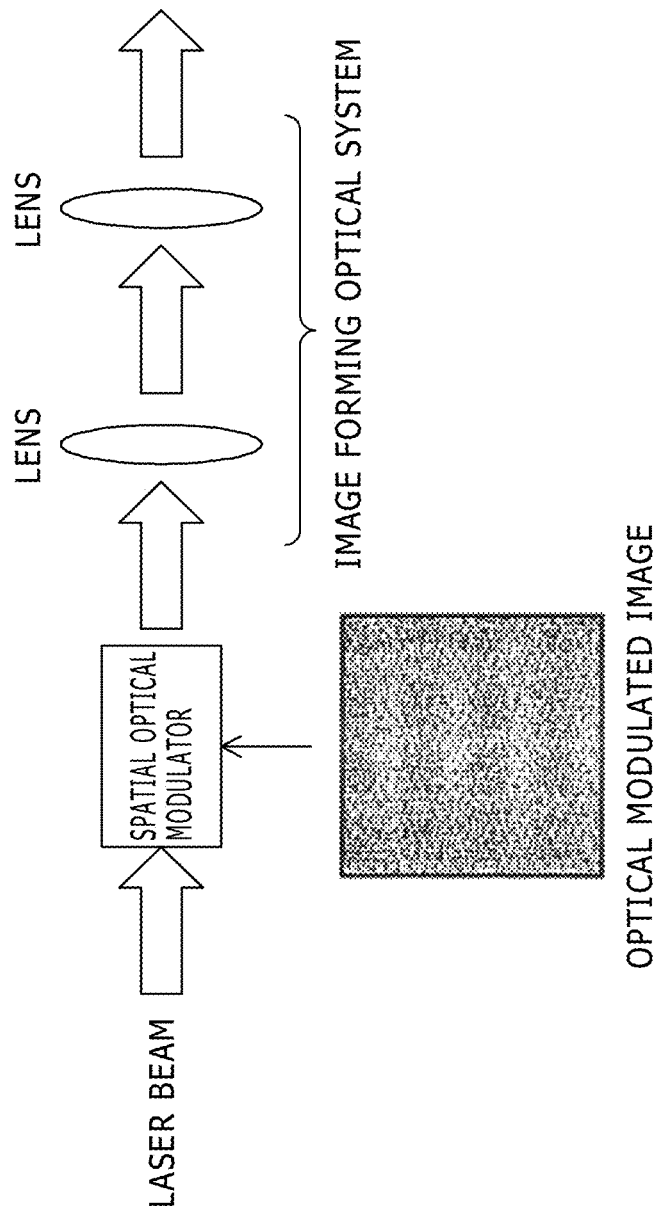
FIG. 6 is a view showing an exemplary structure of an image forming optical system.

Fig. 6 shows an exemplary structure of the image forming optical system 108. Referring to the example shown in FIG. 6, two lenses constitute the image forming optical system. However, three or more lenses may be used as the constituent elements. The glass with large refractive index dispersion is used as the material for forming the lens so as to intentionally introduce chromatic aberration contrary to the normally conducted chromatic aberration correction. The magnification of the image forming optical system 108 is set as the function of the glass refractive index. This makes it possible to appropriately set the curved surface of each lens, glass type, and the number of lenses, and set the magnification of the image forming optical system 108 as the monotone decreasing function to the wavelength, thus suppressing lowering of the optical spot intensity as described above.

Figure 7:
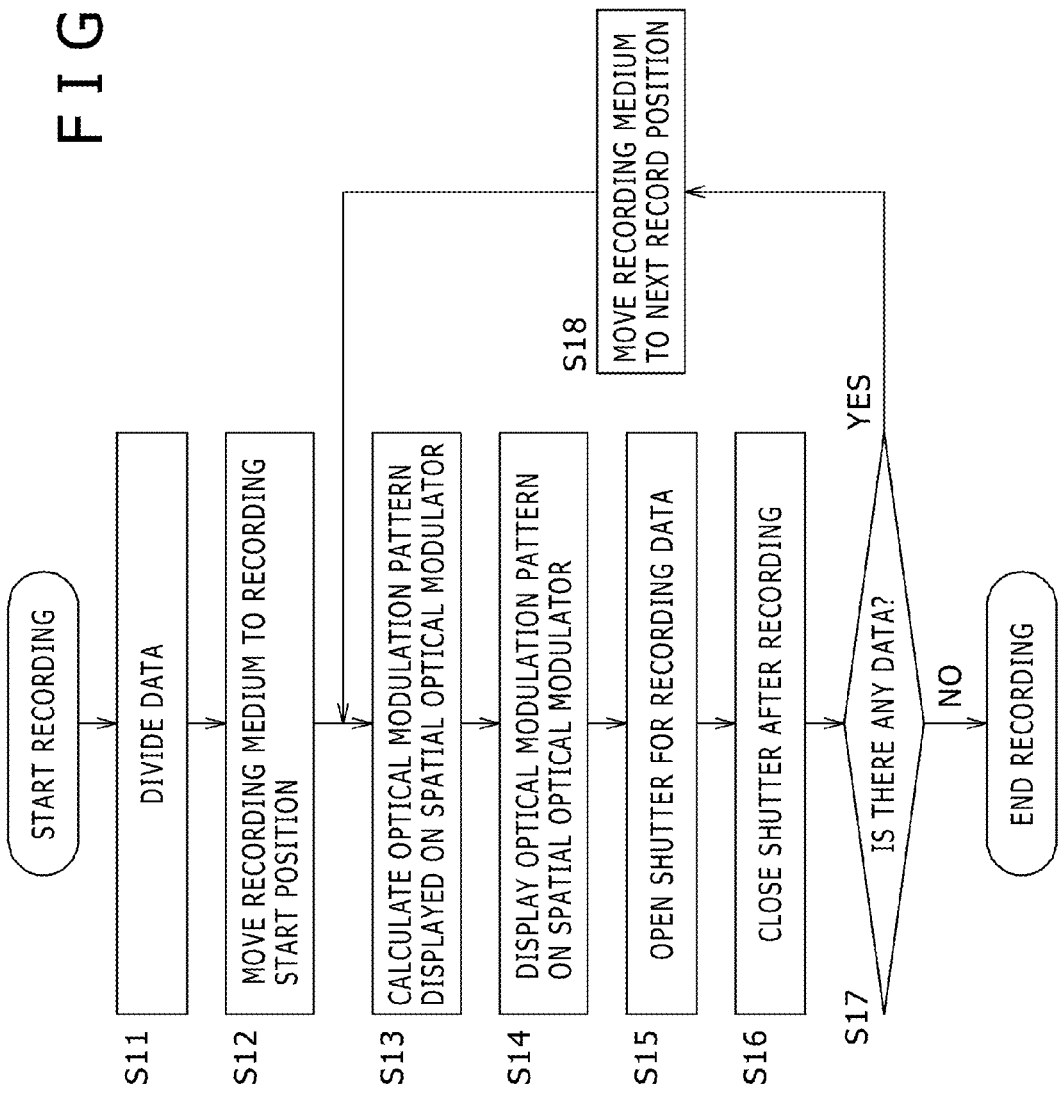
FIG. 7 is an explanatory view representing operation steps of the recording device.

FIG. 7 represents operation steps of the recording device. Firstly, the data is divided into a plurality of pieces so as to ensure sufficiently high recording quality of the divided data upon recording (S11). Specifically, the data is divided so that each length of all optical spots in the optical spot pattern for recording the divided data is in the range of 125% of the length of the optical spot on the optical axis. As described above, if the optical intensity of the optical spot becomes lower than 80%, the data recording may fail. Therefore, the optical spot length has to be in the range of 125% as the inverse number. The embodiment is configured to have the image forming optical system where the image forming magnification is in inverse proportion to the parameter relating to the wavelength so as to ensure large data capacity upon division. This makes it possible to increase the recording speed. The divided data is sequentially recorded in the recording medium 111 by performing a plurality of recording operations. After data division, the recording medium 111 is moved to a record start position by the stage 112 (S12). Then, based on the divided data, the control device 101 calculates the optical modulation pattern to be displayed on the spatial optical modulator 107 (S13), After completion of calculation, the control device 101 controls the spatial optical modulator 107 to display the calculated optical modulation pattern (S14). Then the control device 101 opens the shutter 104 for recording the data in the recording medium (S15), After completion of the data recording, the shutter 104 is closed (S16). The control device 101 further determines whether there is any data to be recorded (S17). If the data exists, the stage 112 is driven to move the recording medium to the next record position (S18). After moving, calculation of the optical modulation pattern corresponding to the next record data is started. The series of operations from calculation of the optical modulation pattern to movement by the stage are repeatedly performed until all data is recorded.

Second Embodiment

Figure 8:
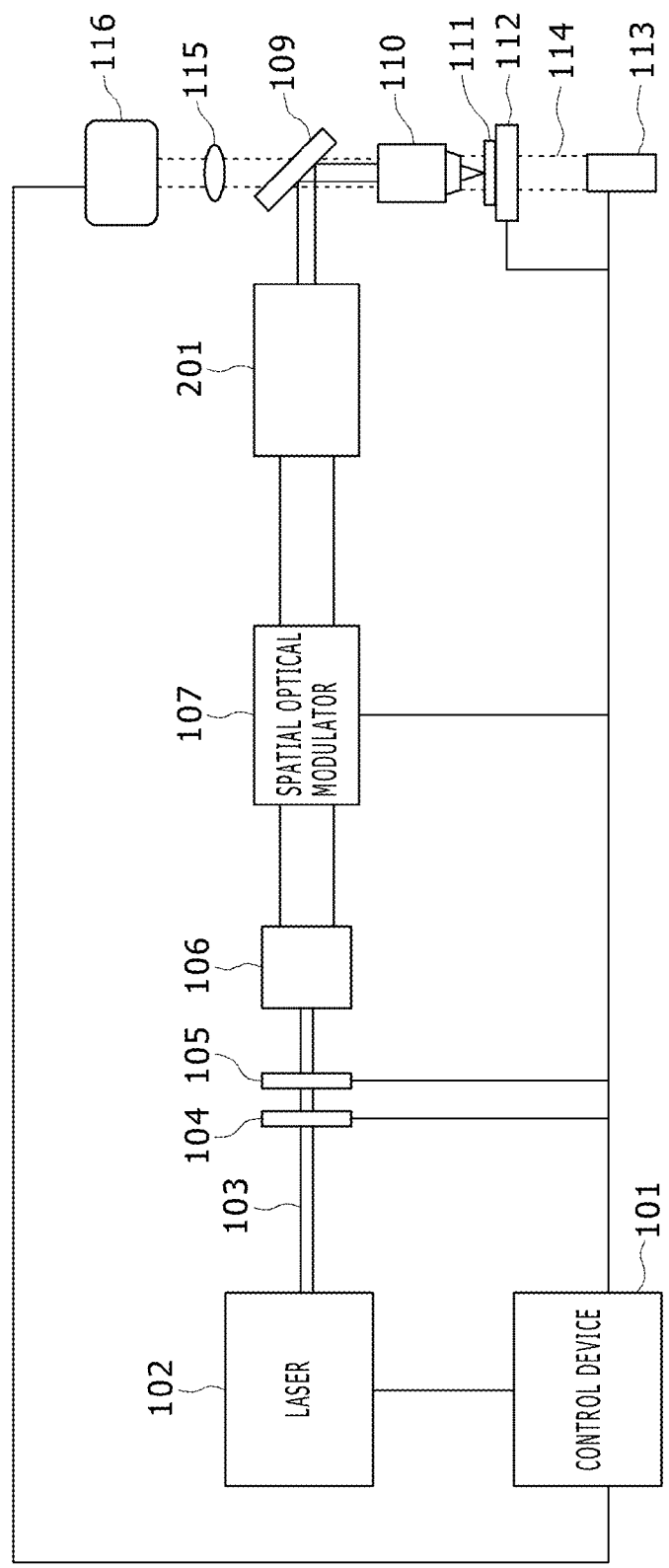
FIG. 8 is a schematic view representing an embodiment of the information recording device according to the present invention.

FIG. 8 is a schematic view representing another embodiment of the information recording device according to the present invention. The same components as those shown in FIG. 3 are designated as the same codes, and detailed description thereof, thus will be omitted.

The configuration from emission of the laser beam 103 from the short pulse laser 102 to irradiation of the laser beam 103 to the spatial optical modulator 107 is the same as the one described in the first embodiment. The embodiment is different from the first embodiment in that the function of the image forming optical system 108 is partially realized as the phase pattern on the spatial optical modulator 107. The remaining function of the image forming optical system 108 is realized by an optical system 201. In this embodiment, the function for preventing enlargement of the optical spot as described above is implemented by the spatial optical modulator 107. The subsequently disposed lens serves to realize the image thrilling function. The optical system 107 does not have to be constituted by the single lens, but may be constituted by a plurality of lenses or any other optical elements. The configuration of this embodiment allows the image forming optical system 108 to be made simpler than the configuration as described in the first embodiment.

Figure 9:
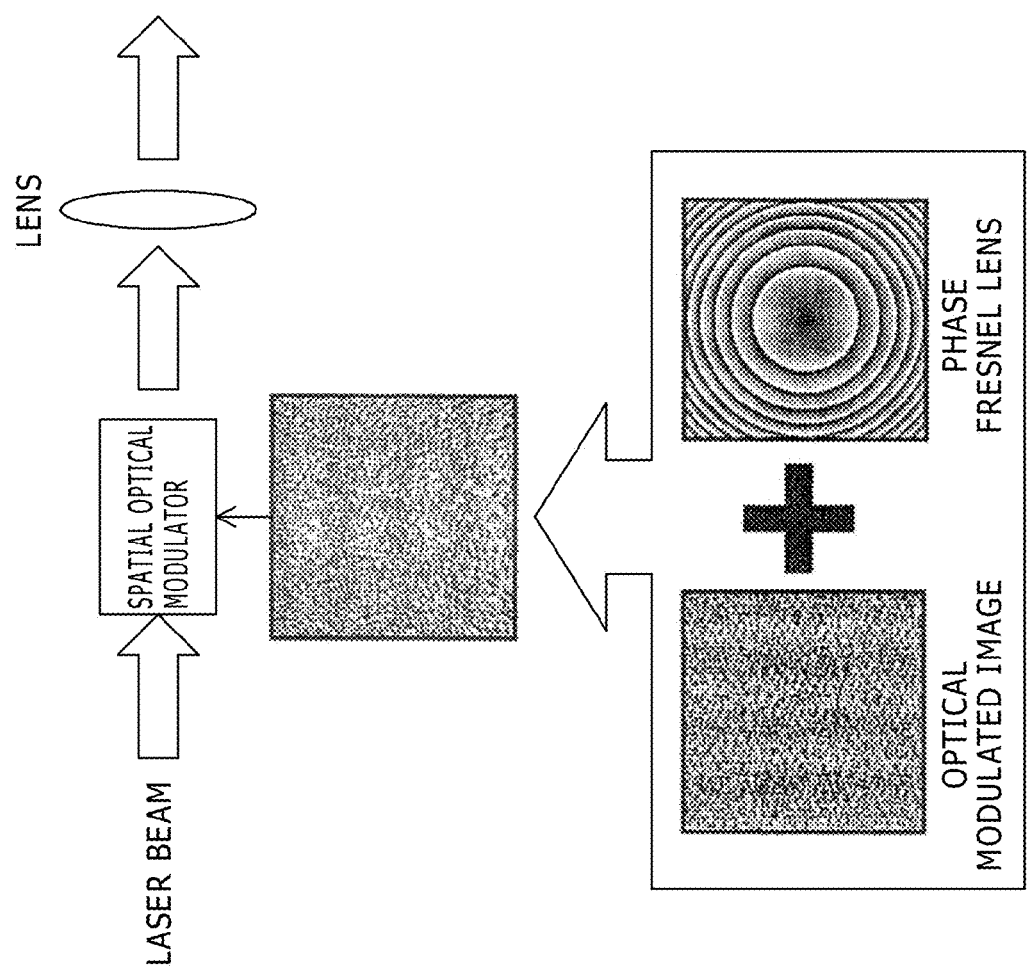
FIG. 9 is a view showing an example that the function of the image forming optical system is partially implemented by the pattern on the spatial optical modulator.

A phase Fresnel lens may be exemplified as the pattern on the spatial optical modulator fir partially realizing the function of the image forming optical system 108. Referring to FIG. 9, the pattern constituting the phase Fresnel lens is added to the optical modulation pattern displayed on the spatial optical modulator 107 for forming the optical spot so as to impart the function as the phase Fresnel lens to the spatial optical modulator 107. The phase Fresnel lens pattern does not have to be varied in accordance with the optical modulation pattern to be used for data recording. Upon repetitive recording, the optical modulation pattern indicating the record data may only be varied while adding the same Fresnel lens pattern. The pattern constituting the Fresnel lens refers to the one for adding the phase in proportion to the second power of the distance r from the optical axis to the laser beam 103. Upon addition of the phase $Ar^2$ to the laser beam 103, the focal length f may be expressed by the following formula.

$$f = \frac{\pi}{A\lambda} \qquad \text{Formula 7}$$

Based on the aforementioned pattern, the lens with the focal length in inverse proportion to the wavelength is formed, The magnification of the optical spot pattern is also in inverse proportion to the wavelength.

Figure 10:
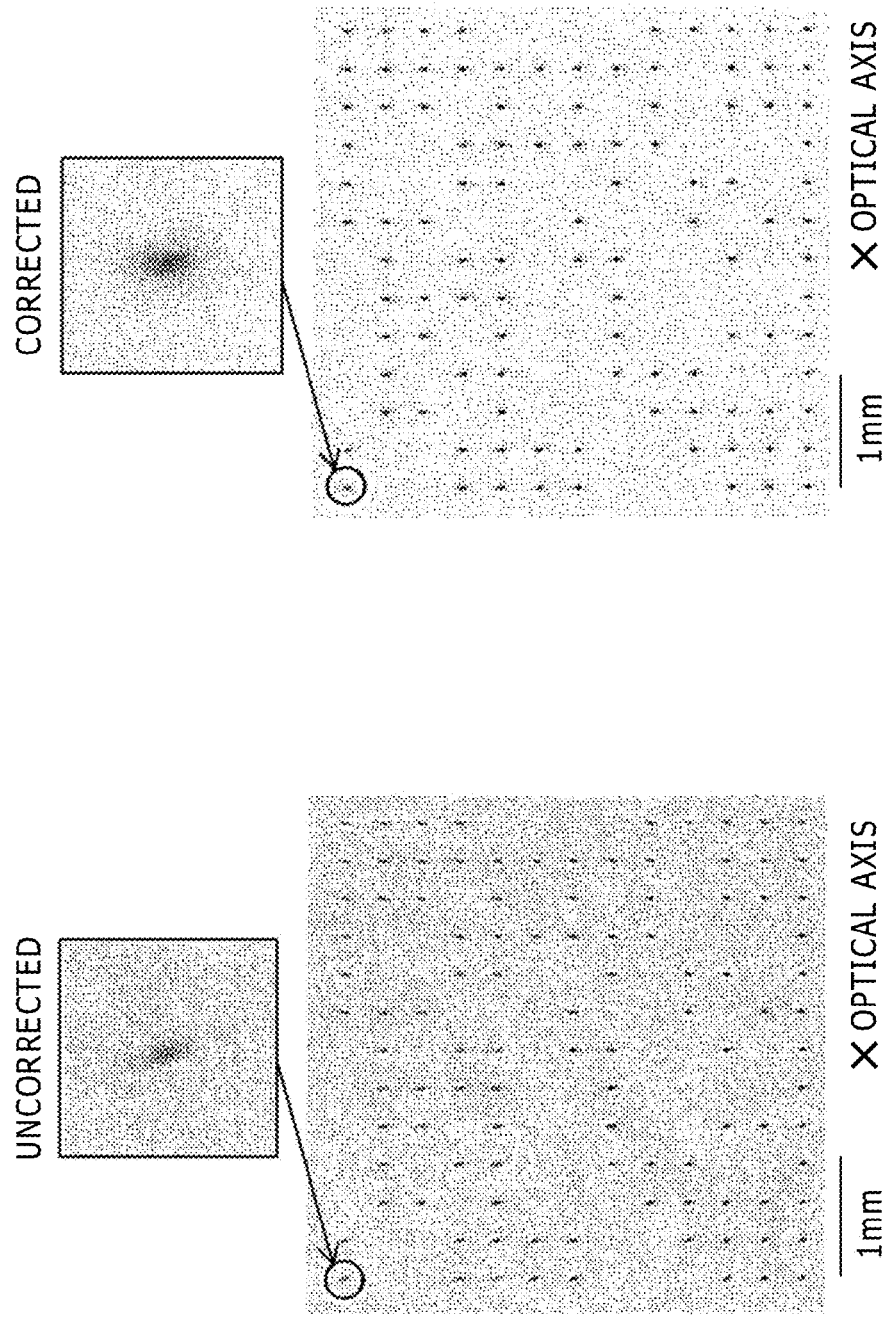
FIG. 10 is a view representing suppression of the spot enlargement by the structure according to the present invention.

FIG. 10 represents a comparison between the optical spot pattern corrected by the structure according to the embodiment and the uncorrected optical spot pattern. Referring to FIG. 10, the optical intensity ratio of the spot closest to the optical axis, that is, the spot with the highest intensity to the spot farthest from the optical axis is 0.53 in the uncorrected case. In the corrected case, the ratio is 0.8. Therefore, the intensity of the optical spot deviating from the allowable optical intensity fluctuation in the uncorrected case may be in the allowable range through correction. In other words, the batch recordable bit number is increased, and accordingly, the recording speed is increased.

Third Embodiment

Figure 11:
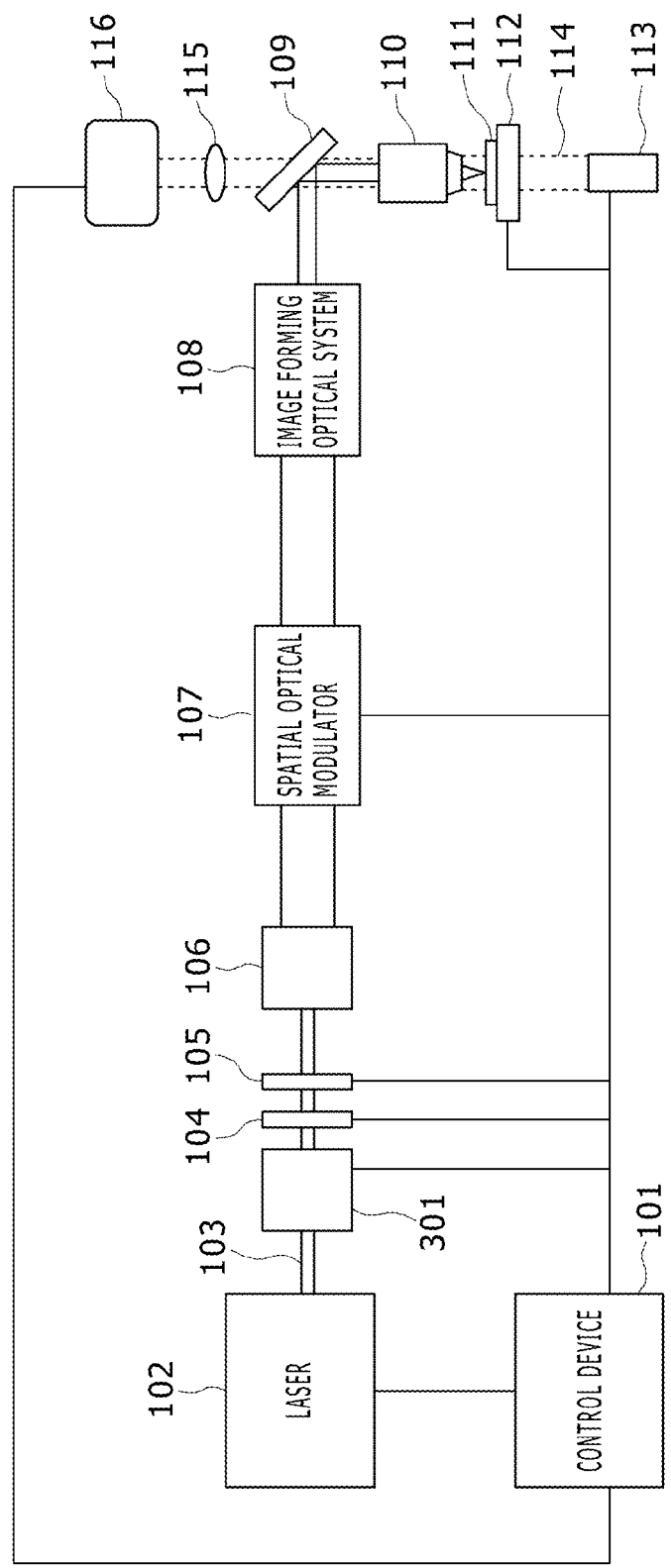
FIG. 11 is a schematic view representing an embodiment of the information recording device according to the present invention.

FIG. 11 is a schematic view representing another embodiment of the information recording device according to the present invention. The same components as those shown in FIG. 3 are designated as the same codes, and detailed description thereof will be omitted. The structure shown in FIG. 11 is the same as the one shown in FIG. 3 except that the laser beam 103 is subjected to chirp correction by a chirp correction mechanism 301 prior to the step for irradiating the spatial optical modulator 107 with the laser beam 103.

Figure 12:
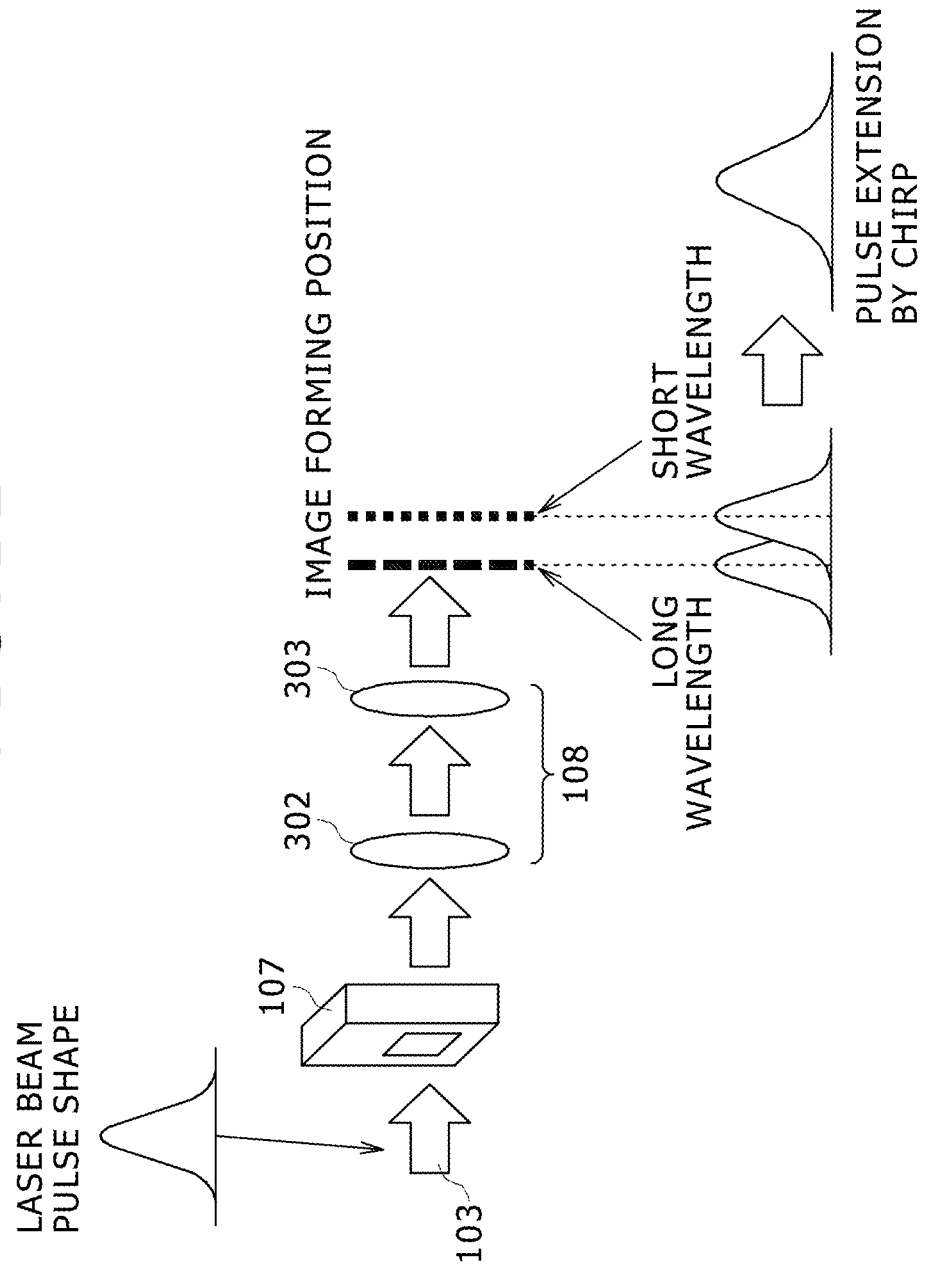
FIG. 12 is an explanatory view representing pulse extension caused by a chirp introduced by the image forming optical system.

The structure shown in FIG. 3 may cause the pulse extension by the chirp depending on the structure of the image forming optical system 108. For example, in the case where the image forming optical system 108 is constituted by a lens 302 having the focal length in inverse proportion to the wavelength and a normal lens 303 as shown in FIG. 12, the image forming position of the long-wavelength component becomes different from that of the short-wavelength component. As a result, the chirp is applied to the optical pulse, resulting in extended pulse width. For example, assuming that the laser beam with center wavelength of 800 nm and spectral width of 10 nm is used for forming the image by the lens having the focal length of 500 mm with respect to the center wavelength in inverse proportion to the wavelength, the image forming position shifts by 6 mm. If such shift is projected by the 50-power objective lens 110, the shift of the image forming position becomes 0.12 mm at the position of the recording medium 111. This value is equivalent to the time of 400 fs. The use of the system configured to set the pulse width of the laser beam emitted by the short pulse laser 102 to be below 100 fs will increase the pulse width by 4 times or larger.

Figure 13:
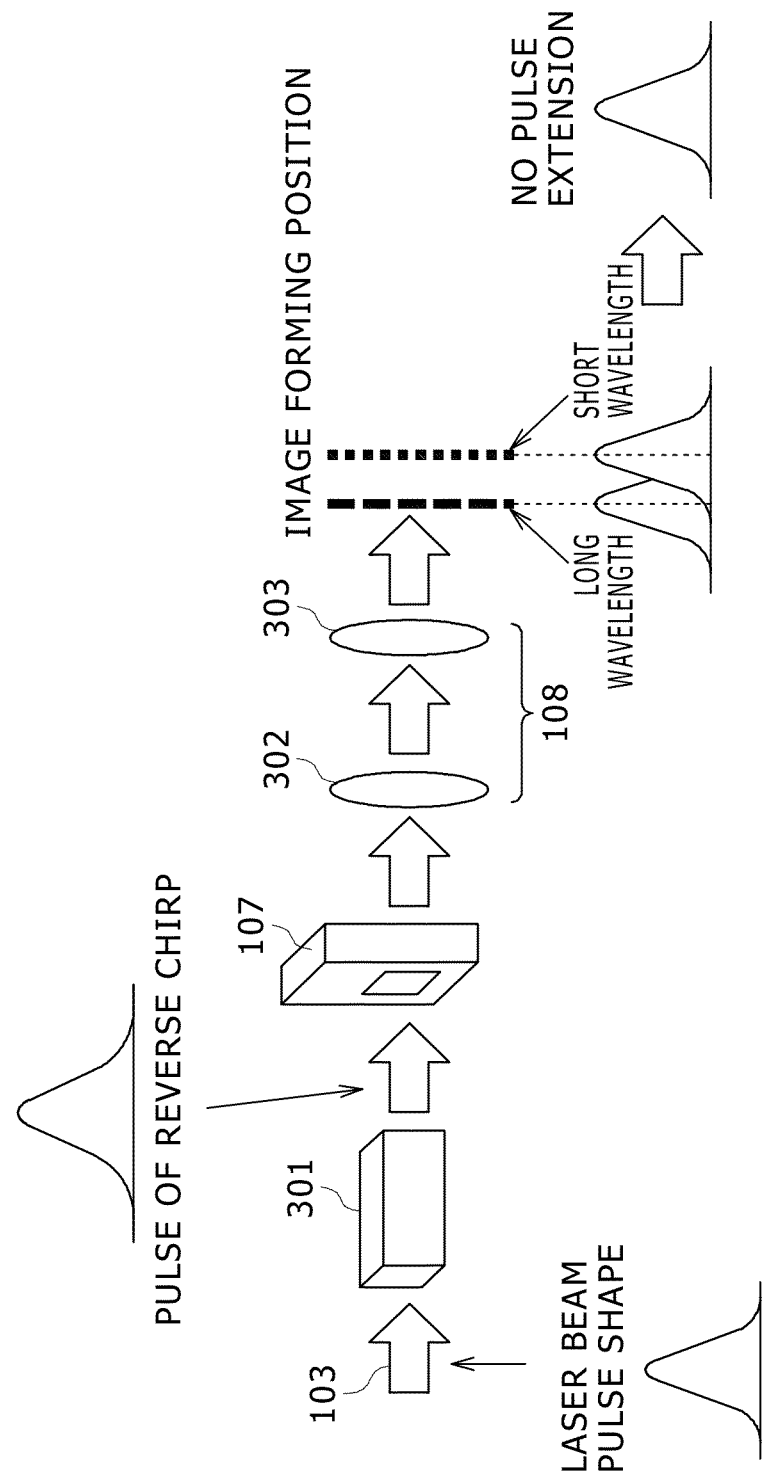
FIG. 13 is an explanatory view representing suppression of the pulse extension by a chirp correction mechanism.

Depending on characteristics of the laser beam 102, and material of the recording medium 111, the pulse extension owing to the chirp may cause problems of deterioration in the recording quality and boost in the optimum recording power. In this embodiment, as shown in FIG. 13, the chirp correction mechanism 301 is configured to add the chirp with the inverted code and the same size as the one which has been preliminarily introduced by the image forming optical system 108. This ensures to suppress the pulse extension, and keep the pulse width constant as well as the recording quality even if the image forming positions of the image forming optical system 108 are different for the respective wavelengths.

Fourth Embodiment

FIG. 14 illustrates a principle of the optical spot intensity correction as another embodiment according to the present invention. In this embodiment, the image limning optical system 108 is partially or entirely constituted by a lens array in which a plurality of lenses each having the same focal length are arranged in a plane perpendicular to the optical axis of the laser beam. Each lens for constituting the lens array forms a partial image of the hologram pattern displayed on the spatial optical modulator 107. In other words, as shown in FIG. 14, the hologram pattern (1) is formed by the lens (1), and the optical spot in the region (1) is formed in the recording medium 111. The hologram pattern with any other number will be formed by the corresponding lens so that the corresponding optical spot pattern is formed in the recording medium 111. Each of those lenses forms an image only in the region where the optical spot intensity for recording becomes equal to 80% or higher than that of the optical spot generated on the center axis of the respective lenses. The hologram pattern is derived from connecting the calculated patterns at the respective lens positions, and displayed on the spatial optical modulator 107. Preferably, the lens array is made of glass from the viewpoint of resistance against the laser beam.

The present invention is not limited to the embodiments as described above, and includes various modifications. For example, the embodiments are described in detail for readily understanding of the present invention which is not necessarily limited to the one equipped with all structures as described above. It is possible to replace a part of the structure of one embodiment with the structure of another embodiment. The one embodiment may be provided with an additional structure of another embodiment. It is further possible to add, remove, and replace the other structure to, from and with a part of the structure of the respective embodiments.

LIST OF REFERENCE SIGNS

101: control device
102: short pulse laser
103: laser beam
104: shutter
105: attenuator
106: beam diameter change optical system
107: spatial optical modulator
108: image forming optical system
109: dichroic mirror
110: objective lens
111: recording medium
112: stage
113: illumination light source
114: illumination light for observation
115: image forming lens
116: camera
201: optical system
301: chirp correction mechanism

The invention claimed is:

1. An information recording device comprising:
a stage for holding an information recording medium;
a short pulse laser source that emits a laser beam;
a spatial optical modulator that displays a hologram pattern so that the laser beam emitted from the short pulse laser source is modulated; and
an image forming optical system having a focal length in inverse proportion to a parameter relating to a wavelength of the laser beam, wherein a multi-point optical spot in accordance with the hologram pattern displayed on the spatial optical modulator is formed in the information recording medium held by the stage via the image forming optical system; and a structural change is caused in the information recording medium by the multi-point optical spot for information batch recording by utilizing at least a region where an intensity of the multi-point optical spot for recording is equal to or lower than 80% of an intensity of the multi-point optical spot on an optical axis in the case where the focal length of the image forming optical system does not depend on the wavelength.

2. The information recording device according to claim 1, wherein the image forming optical system includes a lens disposed between the spatial optical modulator and the information recording medium.

3. The information recording device according to claim 2, wherein the image forming optical system includes a plurality of lenses.

4. The information recording device according to claim 1, wherein a function of the image forming optical system is partially realized by a pattern displayed on the spatial optical modulator.

5. The information recording device according to claim 1, further comprising:

a chirp corrector for correcting a chirp of the laser beam emitted from the short pulse laser source and which is disposed between the short pulse laser source and the spatial optical modulator.

6. An information recording method for performing information batch recording, in which a short pulse laser beam is modulated with a hologram pattern displayed on a spatial optical modulator to irradiate an information recording medium with a multi-point optical spot to cause a structural change in the information recording medium for information batch recording, the method comprising:

a step of adjusting an optical irradiation position to the information recording medium; and a step of forming the multi-point optical spot in the information recording medium by setting the short pulse laser beam so that a length of the optical spot for recording is in a range of 125% of the length of the multi-point optical spot on an optical axis via an image forming optical system having a focal length in inverse proportion to a parameter relating to a wavelength of the short pulse laser beam.

* * * * *